(12) United States Patent
Demizu et al.

(10) Patent No.: US 6,787,797 B2
(45) Date of Patent: Sep. 7, 2004

(54) SEMICONDUCTOR WAFER AND DEVICE FOR SEMICONDUCTOR DEVICE MANUFACTURING PROCESS

(75) Inventors: Kiyoshi Demizu, Tokyo (JP); Tadahiro Kato, Fukushima (JP); Shigeyoshi Netsu, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 78 days.

(21) Appl. No.: 10/019,056

(22) PCT Filed: Apr. 26, 2001

(86) PCT No.: PCT/JP01/03635
§ 371 (c)(1),
(2), (4) Date: Apr. 22, 2002

(87) PCT Pub. No.: WO01/84606
PCT Pub. Date: Nov. 8, 2001

(65) Prior Publication Data
US 2002/0167006 A1 Nov. 14, 2002

(30) Foreign Application Priority Data
Apr. 27, 2000 (JP) ........................................ 2000-128502

(51) Int. Cl.⁷ .............................................. H01L 23/58
(52) U.S. Cl. .............................. 257/48; 27/739; 438/14
(58) Field of Search ...................... 257/48, 739; 438/14, 438/928, 959, 964, 974

(56) References Cited

U.S. PATENT DOCUMENTS 5,738,751 A    4/1998 Camerson
6,368,881 B1 * 4/2002 Brouillette et al. ............ 438/7

FOREIGN PATENT DOCUMENTS

JP    140838/1990    11/1990
JP    1056054        2/1998

OTHER PUBLICATIONS

Copy of the Search Report.

* cited by examiner

Primary Examiner—Thien F Tran
(74) Attorney, Agent, or Firm—Crowell & Moring LLP

(57) ABSTRACT

In order to improve the productivity or production yield of chips in the process for device fabrication, the present invention provides a wafer or an apparatus of process for fabricating semiconductor devices having the backside of the wafer or the surface of a wafer holding means adjusted so as to have a distribution in contact surface density between the surface of the wafer holding means and the backside of the wafer when the semiconductor wafer is held on the wafer holding means in the process for fabricating devices.

19 Claims, 11 Drawing Sheets

Temperature Distribution in Wafer Surface
Comparative Example

Temperature Distribution in Wafer Surface
Example 1

Temperature Distribution in Wafer Surface
Example 2

SEMICONDUCTOR WAFER AND DEVICE FOR SEMICONDUCTOR DEVICE MANUFACTURING PROCESS

BACKGROUND OF THE INVENTION

1. Fields of the Invention

The present invention relates to a semiconductor wafer and an apparatus of the process for fabricating semiconductor devices in terms of improving the productivity of the process for fabricating semiconductor devices and improving the yield of device chips in the process.

2. Description of the Related Art

Concerning the properties of the backside surface of a semiconductor used in the process for fabricating semiconductor devices, it has been said heretofore to be preferable for the good control of the process that the surface is more uniform. As for the surface roughness, it has been considered ideal to be uniform and even. The uniformity within the whole surface of the backside of a wafer has been common even with a backside damaged wafer or a wafer having a polysilicon layer on its backside. In case of more strict condition of fabricating in the process or others, however, the principle heretofore is not always a golden rule.

In the processes fabricating semiconductor devices, many processes such as chemical or physical are carried out on the surface of a wafer. The wafer is held by a holding means such as a vacuum chuck or an electrostatic chuck to hold the wafer stable in the apparatus used in the processes. Under these circumstances, the backside of the wafer comes in contact with the surface of the holding means. The wafer and the holding means influence each other through the contact surfaces with regard to the physical phenomena such as suction or heat transfer. Hence, the state of the contact with each other, or more specifically, backside of the wafer that takes part in the contact varies the mutual "contact surface density", which is defined hereinafter, to influence the effect of these physical phenomena and affect considerably the efficiency and a result of the process of fabricating the device as well.

Contact surface density is defined herein as an index indicating a ratio of the real area of the mutual physical contact to the apparent area of contact in the state of two objects, such as a wafer and a holding means contacting each other. As shown in the schematic drawing of FIG. 1 which illustrates microscopically the sectional view of the area of the contact point, the contact surface density is defined as a ratio of the integrated sum of real small contact areas Δs of the mutual physical contact to the apparent contact area S; hence the form of the equation may be written as follows.

contact surface density(%)=(ΣΔ$s$/$S$)×100

In case a wafer is processed by heating in a device fabrication process, the contact surface density of the backside surface of the wafer on the surface of the wafer holding means affects the heat transfer behavior between them. As a result, when the contact surface density in the apparent mutual contact area (hereinafter referred to as "contact area" simply) has a distribution, the temperature in the front surface of the wafer becomes non-uniform in accordance with the distribution. It follows therefore that the rate of processing within a wafer surface comes to also have a distribution.

In order to avoid this drawback, the wafer having the state on its backside surface of as small surface roughness and as excellent uniformity as possible have been used heretofore.

As stated above, however, when the device fabricating process is carried out by placing a conventional wafer having a uniform backside surface within a plane on a conventional wafer holder, the temperature in the wafer surface of the peripheral part of the wafer differs from that in other parts. That is nothing but the condition of heat transfer is different whether the place is in the periheral part or in other inner parts. Since the temperature condition of the process which should bring about the proper quality is set appropriately in accordance with the vicinity of the center of nearly flatly distributed temperature, the devices produced from the peripheral part of the wafer whose temperature condition is not always consistent with the proper temperature condition of the process are discarded as failure products.

In technical views obtained international consensus, when the line width of the patterning size on a device was 0.25 μm, the patterned region within 3 mm in the direction of the diameter from the circumference of a wafer was excluded as out of the specification. When the line width is 0.15 μm, the region which should be excluded is to be 2 mm from the circumference; when 0.1 μm, the region is to be 1 mm. Thus, the target of the specification with this regard is set in order to increase the effective area of a wafer. In case of a 200 mm diameter wafer, for instance, if the region is reduced to 2 mm from 3 mm, the effective area increases by 2%; if the region is reduced to 1 mm from 3 mm, the effective area increases by 4%. In accordance with these facts, it is very important to uniformize the distribution of the temperature from the center region to the circumferential end within the wafer surface in a future device fabrication process.

There is another problem in connection with holding means of a wafer. A method of treating with plasma under reduced pressure is often used in the latest process for fabricating devices. It is often the case to hold a wafer with an electrostatic chuck in this process. In this method, the wafer is held on the face of the chuck with an electrostatic attracting force by applying an electrostatic voltage of several hundred volts between an electrode of the chuck and the wafer on the chuck. The attracting force varies with not only the applied voltage but also the state of contacting the backside of the wafer to the face of the chuck i.e. the state of the surface of the both faces. After processing, the wafer is removed off the electrostatic chuck. A series of device fabricating processes has many such same processes or others so that the wafer removing operations are executed repeatedly after completion of the each process.

The wafer removing operations are carried out by releasing the application of voltage. When chucking, if the wafer adheres too tightly to the chuck face, a difficulty arises to remove the wafer from the chuck face, as is frequently the way. If the roughness of the contact surfaces is increased too much, the attracting force of chucking reduces accompanied by disadvantage of the leakage of the helium gas applied to the contact faces.

DISCLOSURE OF INVENTION

The present invention has an object of providing a new semiconductor wafer, the state of the back side surface of which is prepared so as to improve the yield and productivity of device-chip fabricating process, and also has an object of providing a method for processing the same.

Further, the present invention has an object of providing a new apparatus of process for fabricating semiconductor device having a wafer holding means with the holding face prepared so as to improve the yield and productivity of device-chip fabricating processes.

The present invention is directed to a semiconductor wafer having the roughness of the backside surface varied in a direction of a radius, wherein varied sections exist substantially coaxially in the direction of the radius or sections of the different roughness exist at least in a peripheral part of the wafer and in the arbitrary sections inner than the periphery.

According to the present invention, when a conventional wafer of uniform backside roughness is not sufficient for the control of a device fabrication process, the problems that have been difficult to solve by the conventional method can be coped with using the new wafer having the roughness of the backside surface varied in the direction of the radius.

Further according to the present invention, the variation of the roughness of the backside surface in the direction of the radius, that is the roughness variation, may be continuous in the direction of the radius or stepwise so that the roughness varies with each approximately designated annular width in the radius direction, the selection of which depends on the object or the ease of the process to make the backside such rough.

A roughness wavelength of the coarser section in the roughness of the wafer backside surface is preferably within the range of 5 to 100 μm.

Further, the present invention is directed to a semiconductor wafer, which is held on a wafer holding means by a face to face contact of the whole backside surface, having a contact surface density forming means of the backside surface thereof, the means prepared so as to vary in a direction of a radius to have a varying contact surface density distribution in the direction of the radius with respect to the contact surface density of the backside of the wafer to the wafer holding means.

As the contact surface density forming means, a surface roughness distribution varied in the direction of the radius is generally applicable and a chemically denatured surface state such as forming of oxide film state is also possible by selection.

In case the both surfaces are ideally smooth flat planes when the surface of the backside of the wafer contacts the surface of the wafer holding means, the area contacting each other, the apparent contacting area, is equal to the real contacting area; thus the contact surface density is 100%. The actual surface has a roughness, which depends on the finish process so that the contact surface density is below 100%. It goes without saying that the finer the surface is the greater the contact surface density becomes. The contact density may also varies by the amount of weight applied to the contact faces in case the surface material is not a complete rigid body.

An effective way to vary the backside of the wafer so as to have a distribution of the contact surface density, when the backside of wafer contacts the surface of the wafer holding means, is that the roughness of the backside of the wafer have a distribution within the contact area. The present invention is further directed to the wafer having a contact surface density distribution applied by a surface roughness of the backside of the wafer in the direction of the radius with regard to the state of wafer setting on a wafer holding means of an apparatus of process for fabricating devices.

Though the roughness of the backside of a wafer varies with the states of finish, as stated above, the actual roughness observed is a resultant roughness of a sum of the individual roughness of various wavelengths. There are many kinds of the roughness components such as a roughness having a wavelength of nanometer order observed by atomic force microscopy which is used for the fine area under several microns, a roughness having a wavelength of micron to millimeter order observed by optical measurement which is used for the medium area ranging several hundred micron to several millimeters and a roughness having a wavelength of millimeter to centimeter order observed by electrostatic measurement which is used for the large area ranging several millimeters to several centimeters.

The roughness distribution within the contact area of the backside of the wafer is effective when the distribution falls into the wavelength range of 5 to 100 μm, or more preferably 10 to 50 μm according to the present invention. In case the roughness wavelength is 5 μm or less, the advantage of the present invention dose not appear because the effect of the roughness for the contact surface density is small. In case the roughness wavelength surpasses 100 μm, it is undesirable because the evenness of the wafer gets worse.

The present invention is also directed to a wafer having a coarser surface in the outer section near circumferece and a finer surface in the center section within the backside surface of the wafer, or to a wafer having a finer surface in the outer section near periphery and a coarser surface in the center section within the backside surface of the wafer, according to the direction of the heat flow in a process when the wafer is set on the wafer holding means; and the variation of the coarse surface to fine surface or that of the fine surface to the coarse surface may be continuous or stepwise in each case.

Since the section of the backside surface of the wafer that is necessary to have the roughness distribution in order to avoid the non-uniformity of the temperature in the front surface of the wafer in the outer section near circumference as stated in the problem heretofore is limited in the vicinity of the periphery, the roughness variation in the vicinity of the periphery is enough and the roughness in the other part may be uniform to attain the object of the present invention though the extent of the variation would be different in accordance with the apparatus of a process, a kind of a process or the object to utilize the effect of the present invention.

A process to vary the roughness within the backside surface of a wafer may be carried out to give the distribution thereto on the way to proceed polishing successively the whole surface through an even rough surface to a finer surface. However, the present invention is also directed to a semiconductor wafer having the distribution by mirror polishing the backside of the wafer followed by etching. The stepwise roughness distribution may be given in the direction of the wafer radius by etching covering the center section or the peripheral section with a corrosion-resistant material.

Further, another method for processing the backside of a wafer the present invention provides is a method comprising giving a roughness distribution in the direction of the wafer radius by mirror polishing the backside surface of a wafer and surface grinding the surface in succession.

Further, the present invention is also directed to a wafer, provided by another method for processing the backside of a wafer, having a roughness distribution by forming an oxide film on the backside of the wafer, etching a part of the oxide film, removing the rest of the oxide film by polishing the whole backside surface. As a more specific method, present invention provides a method comprising giving a roughness distribution in the direction of the wafer radius by insert tightly the wafer coaxially between two disk-like pads of corrosion-resistant material having the diameter smaller than the diameter of the wafer, removing the oxide film of the exposed part like an annular rim by etching, removing the residual oxide film of the center region while mirror polishing the annular part by mirror polishing the backside of the wafer.

Further, present invention also provides a method comprising giving a roughness distribution in the direction of the wafer radius by insert tightly the wafer coaxially between two annular rim like pads of corrosion-resistant material having the outer diameter equal to or larger than the diameter of the wafer and the inner diameter smaller than the diameter of the wafer, removing the oxide film of the exposed disk like part by etching and removing the residual oxide film of the annular region while mirror polishing the center part by mirror polishing the backside of the wafer.

In addition to the aforementioned methods for giving the roughness distribution, process methods for giving a contact surface density distribution to the backside of a wafer or the surface of a wafer holding means are not limited within the above illustrated methods but vary with such as a method comprising a step of providing recessed regions on the surface of the backside of the wafer, or more specifically, providing a plurality of coaxially annular narrow grooves varying with the width of the grooves or the number of the grooves or providing a plurality of small circular recesses forming such a pattern that the area of the recesses or the density of the number of the circular recesses varies.

When the temperature in the surface of a wafer in the process of fabricating devices has a distribution shown in FIG. 2(B) in spite of a uniform contact surface density between the wafer and the wafer holding means, the wafer having the roughness distribution of the backside shown in FIG. 3(A) lower part in case heat flows from the wafer toward the holding means should be used, while in case heat flows from the holding means toward the wafer on the contrary, the wafer having the roughness distribution of the backside shown in FIG. 3(B) lower part should be used according to the present invention. Because, in the former case, a resistance to heat conductivity through contact face increases since the contact surface density decreases in the periphery of the wafer having a larger roughness value so that the restraint of the heat conduct in this region enables the temperature distribution in the wafer surface uniform in the whole area of the wafer. On the contrary, in the latter case, since the heat conduction to the wafer from the wafer holding means is enhanced more in the periphery of the wafer than in the center region using the wafer having the backside roughness distribution shown in FIG. 3(B) lower part, the uniformity of the surface temperature in the whole area of the wafer can be improved.

In case the temperature in the surface of the wafer in the process of device fabrication is shown in FIG. 4, the roughness on the backside of the wafer should vary with respect to whether in the peripheral region or the central region so as to enhance or restrain the heat conductance of the peripheral region respectively in accordance with the heat flow between the wafer and the holder.

The problem of detaching the wafer from a chuck such as electrostatic chucking can be effectively solved using the wafer adjusted with the state of the backside surface. Thus, the wafer of the present invention for using to solve the problem is a wafer having a roughness distribution by forming an oxide film on the backside of the wafer, etching a part of the oxide film, removing the rest of the oxide film by polishing the whole backside surface.

Though the part from which the residual oxide film is removed by polishing of thus treated wafer holds the roughness which the wafer have had before the formation of the oxide film, the backside surface of its own wafer material exposed by removing the oxide film before polishing can be polished to any roughness coarser or finer than the roughness before the formation of the oxide film. Since removal of the wafer from the electrostatic chuck begins with the smaller contact surface density part (coarser part of the surface roughness of the backside) of the wafer, the difficulties in detaching the wafer dose not arise.

In a polishing process of the backside after removing a part of the backside oxide film by etching, all the oxide film may be removed. However, polishing may be stopped at the time when the surface roughness becomes small to remove the residual film with diluted hydrofluoric acid.

The oxide film may be formed by any methods selected from usual ways such as vapor deposition, chemical vapor deposition or thermal oxidation whereby the surface is oxidized by heating the wafer in the dry or wet oxidizing atmosphere. Above all others, the thermal oxidation is especially preferable because the oxide film formed by the method is fine and homogeneous.

More specifically, the present invention provides a wafer having a roughness distribution by forming an oxide film on the backside of the wafer, insert tightly the wafer coaxially between two disk like pads of corrosion-resistant material having the diameter smaller than the diameter of the wafer, removing the oxide film of the exposed part like an annular rim by etching, removing the residual oxide film of the center region while mirror polishing the annular part by mirror polishing the backside of the wafer. With such wafer, the center region having the coarser backside roughness comes off first; then removal spreads to the annular rim shaped mirror part to proceed with smooth detaching of the whole wafer.

The present invention also provides a wafer having a roughness distribution by forming an oxide film on the backside of the wafer, insert tightly the wafer coaxially between two annular rim like pads of corrosion-resistant material having the outer diameter equal to or larger than the diameter of the wafer and the inner diameter smaller than the diameter of the wafer, removing the oxide film of the exposed disk like part by etching and removing the residual oxide film of the annular region while mirror polishing the center part by mirror polishing the whole backside of the wafer. With such wafer, the annular rim part having the coarser backside roughness comes off first; then removal spreads to the mirror part of the center region to proceed with smooth detaching of the whole wafer.

As a contact between the backside of the wafer and the surface of the wafer holding means is relative in nature, the contact surface density distribution may be realized not only on the backside of the wafer but also on the surface of the wafer holding means.

Therefore, in an apparatus of process for fabricating semiconductor devices wherein the whole backside surface of a wafer is held by a wafer holding means by face to face contact to carry out device fabricating processes thereon, the present invention is directed to an apparatus of process for fabricating semiconductor devices having a means for adjusting a contact surface density at least on the surface of the wafer holding means, the backside of the wafer or a means for applying contact pressure between both surfaces so as to have varying contact surface densities between the wafer and the surface of the wafer holding means in a direction of the wafer diameter. In this case, the adjustment of the contact surface density of the surface of the wafer holing means is done by giving nearly coaxially a roughness distribution in the direction of the radius of the wafer. More specifically, the roughness distribution is given by forming a gathering of annular recesses, dotted recesses or the combination thereof on the center or peripheral part of the surface of the wafer holding means to contact the wafer surface. Further more specifically, the holding means may be prepared by applying a means for providing a plurality of coaxially annular narrow grooves varying with the width of the grooves or the number of the grooves, a means for providing a plurality of small circular recesses forming such a pattern that the area of the recesses or the density of the number of the circular recesses varies or a means for providing a grid-like grooves.

The wafer holding means according to the present invention is applicable particularly for an apparatus of the process for fabricating semiconductor devices having an electrostatic chuck as a holding means.

In this case, a means for applying contact pressure between the wafer holding means and the backside of the wafer may be a means for adjusting the electrostatic charge of the electrostatic chuck. More specifically, the surface of the holding means may be covered coaxially with the material having different electrostatic charge series or the electrostatic charge may be adjusted by varying the charge voltage or resistance on the surface of the holding means.

The operation/working-effect of the present invention in case of providing a contact surface density distribution in the direction of the radius of the wafer by the means for applying contact pressure between the wafer holding means and the backside of the wafer is the same as in the case of providing a contact surface density distribution in the direction of the radius of the wafer on the backside of the wafer itself. The effect concerning the heat transfer is schematically illustrated in FIG. 3. The principle of adjusting the suction force of holding by suction is the same as what is described in case of the wafer.

BRIEF DESCRIPTION OF DRAWINGS

FIG. 6(A) is a side view. FIG. 6(B) is a plane view.

THE BEST MODE FOR CARRYING OUT THE INVENTION

The embodiments of the invention will be described with concrete examples.

Figure 6:
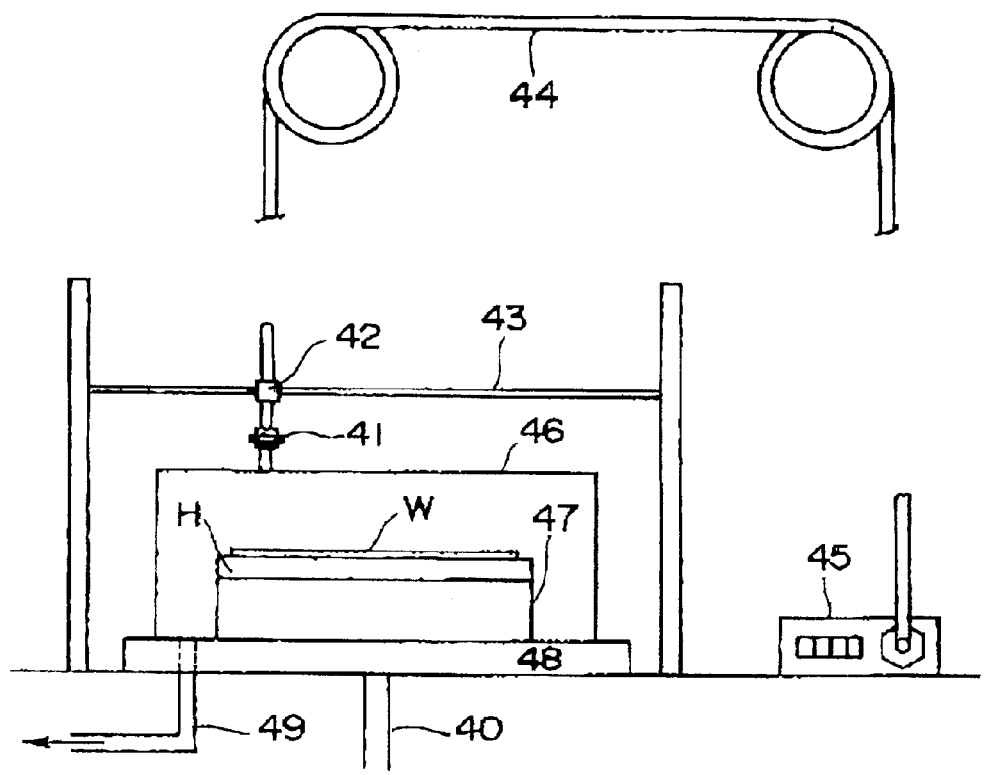
FIG. 6 shows an apparatus for measuring the temperature distribution in the wafer surface.
Figure 6:
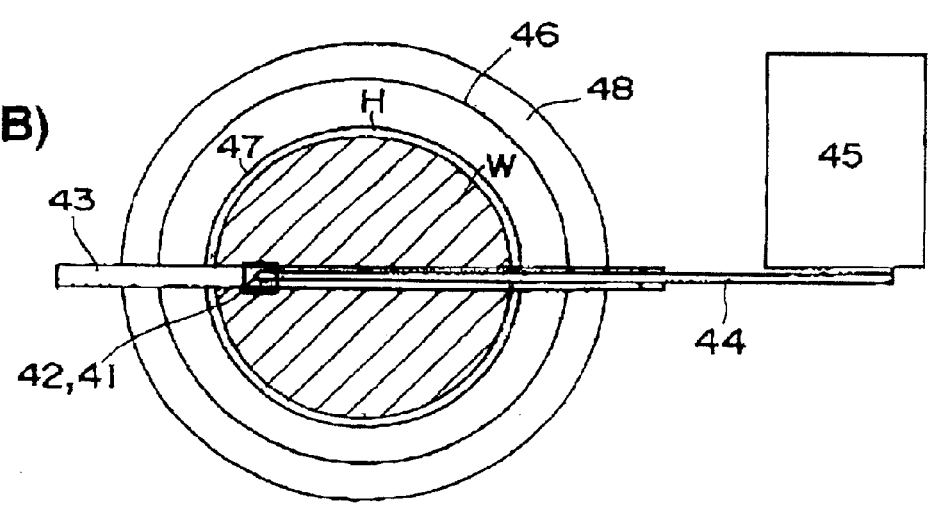

FIG. 6 shows an apparatus for measuring an effect to the temperature distribution in the surface of a wafer wherein the contact surface density distribution in the contact surface of the backside of the wafer of the present invention to the surface of a holding means influences the distribution of the heat flow. FIG. 6(A) is a side view. FIG. 6(B) is a plane view. 46 in the figure denotes a process chamber made of quartz, which connects tightly to a base 48 to keep the inside airtight. An exhaust pipe 49 is connected to an evacuating apparatus. Operating the evacuating apparatus, the inside of the chamber is kept to a designated reduced pressure in accordance with each process for fabricating devices. A wafer holding means 47 is an alumina electrostatic chuck. The part H contacting a wafer contains a heat evolving body or a heat absorbing body to heat or cool uniformly the whole holding surface. The wafer holding means 47 is rotated by the axis 40 while keeping the inside of the chamber airtight. 41 represents a receiving end of the radiation of an optical fiber radiation thermometer. The radiation eradiated from a wafer W passes through optical fiber 44 and is detected by a detecting element in a detector 45, which converts the detected light to an electric signal to output and indicates the surface temperature of the wafer according to the output signal. An infrared radiation temperature measuring apparatus IR-FBS attached with an optical fiber radiation thermometer IR-FLON as a light-collecting device made by CHINO Corporation. was used in the embodiments of the present invention. This apparatus is a monochromatic light narrow wavelength range radiation temperature measuring apparatus with the detector of Si and can measure a temperature ranging 500° C. to 900° C. of 1 mm spot from 100 mm distance using IR-FLON. A precision sliding jig 42 can slide on a sliding beam 43 without play holding the receiving end of the radiation. The sliding jig 42 having a position detecting means, not shown, and a means for moving for a definite distance, not shown, can move continuously or stepwise for a necessary definite distance and the position detecting means generates the signal corresponding to the present position. The signal is memorized and calculated by a memory and a calculating means such as a computer and a part of the memorized and calculated result is backed to the means for moving for a definite distance to control thereof.

Double-side mirror polished wafers of 200 mm diameter without orientation flat sliced from silicon single crystals were used in the following example 1 to 3 and the comparative examples. Samples of wafers having roughness of Ra 14 nm, Rmax 1070 nm on the backside surface being in contact with the electrostatic chuck were used as a standard sample. Roughness was measured by Chapman's optical roughness meter.

COMPARATIVE EXAMPLE

Figure 7:
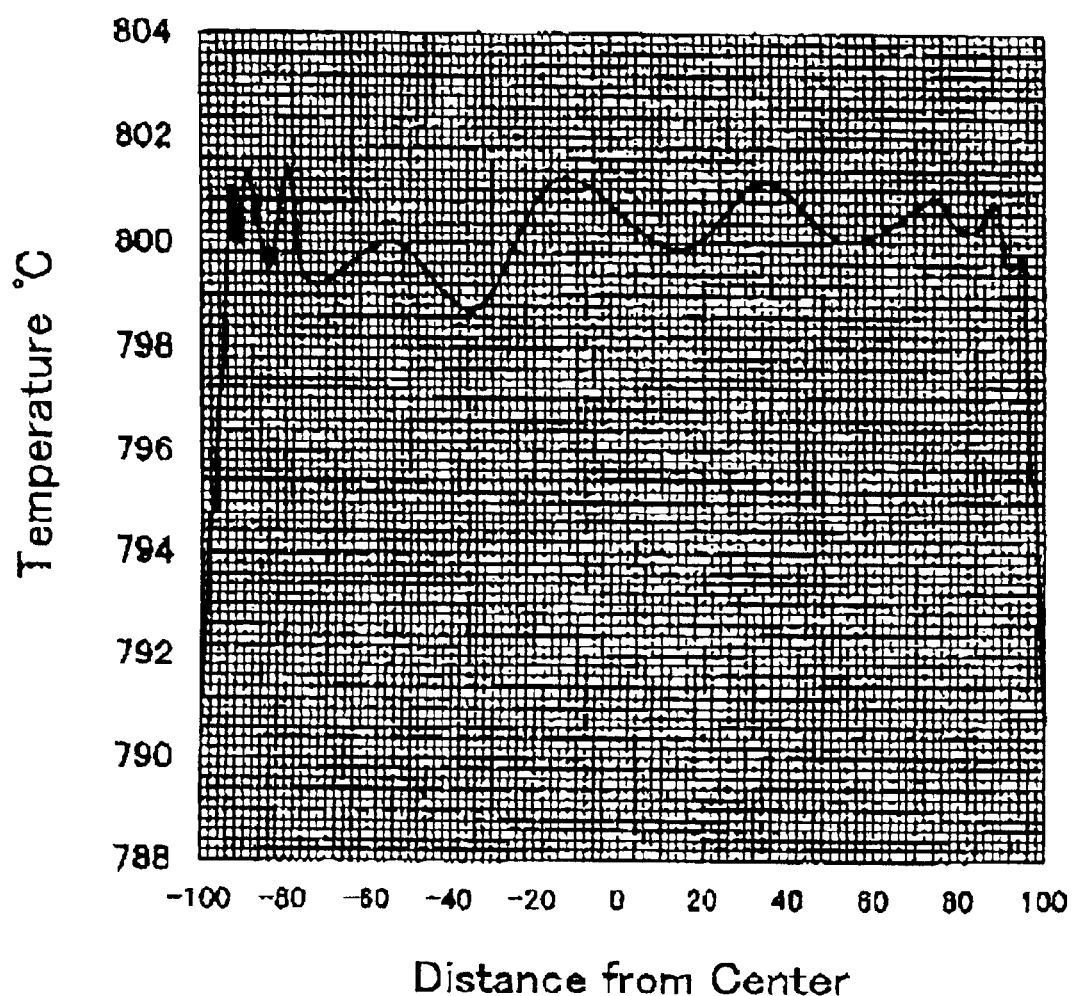
FIG. 7 is a graph showing a temperature distribution in the surface of a wafer.

The aforementioned sample was put on the holding means 47 and the chamber was evacuated with the evacuating apparatus. The slide beam 43, the slide jig 42 and others were set so that the receiving end of the radiation 41 can move above the diameter of the wafer for any distance in any direction, keeping the appropriate definite altitude of about 100 mm above the surface of the wafer W. The temperature in the surface of the wafer is adjusted at approximately 800° C. with a heating device. The temperature of predetermined points on the surface of the wafer W was measured at the predetermined time interval to ascertain the surface temperature of the wafer W became steady state. After that, the wafer in the fixed state (the position in this state is defined as 0 degree of wafer rotation angel) was scanned from the left to the right of the figure with the receiving end 41 to move at a constant velocity and the measured temperature in the surface of the wafer was recorded. Further, the wafer was rotated in the same direction for 45 degrees each to set the each rotation angle of 45, 90 or 135 degrees and repeat the same measurement. The 8 totaled measured values obtained by these 4 times measurements were averaged at each position on the diameter with respect to the center of the wafer, which resulted in the FIG. 7.

Example 1

A wafer having coarser roughness of the peripheral region was prepared by spin-etching the backside of the mirror polished standard sample wafer. That is, the wafer held as backside up was rotated at high rotation rate while etching solution mixed with the reagents of 50% hydrofluoric acid, 70% nitric acid and 80% phosphoric acid was flowed from the central to circumference of the wafer utilizing the centrifugal force of rapid rotation to etch only the backside. A staying time of the etching solution on the backside of the wafer was controlled by controlling the rotating rate and the flow volume of the etching solution so that the peripheral part becomes coarser.

The roughness distribution of the backside surface of the sample varied according to the position within the surface when measured by Chapman's optical roughness meter as shown in table 1.

TABLE 1

|  | Annular rim region within 5 mm from outer periphery | Annular rim region within 190 mm~195 mm from center | Central region within 190 mm from center |
| --- | --- | --- | --- |
| Ra nm | 200 | 130 | 30 |
| Rmax nm | 1800 | 1500 | 1010 |

Figure 8:
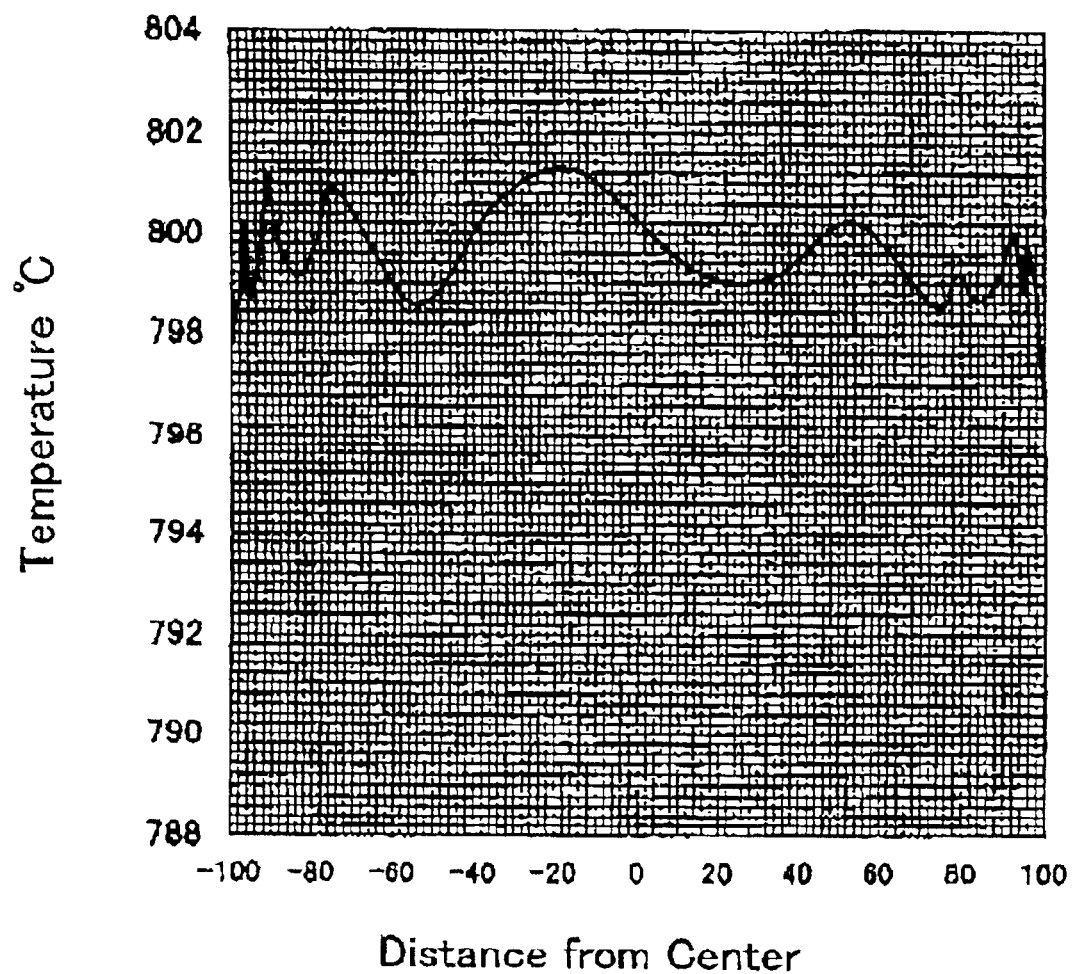
FIG. 8 is a graph showing a temperature distribution in the surface of a wafer.

A sample described in table 1 was set on the holding means 47 and the chamber was evacuated by the evacuating apparatus. The slide beam 43, the slide jig 42 and others were set so that the receiving end of the radiation 41 can move above the diameter of the wafer for any distance in any direction, keeping the appropriate definite altitude of about 100 mm above the surface of the wafer W. The temperature on the surface of the wafer is adjusted at approximately 800° C. with a heating device. The temperature of predetermined points in the surface of the wafer W was measured at the predetermined time interval to ascertain the surface temperature of the wafer W became steady state. After that, the wafer in the fixed state (the position in this state is defined as 0 degree of wafer rotation angel) was scanned from the left to the right of the figure with the receiving end 41 to move at a constant velocity and the measured temperature in the surface of the wafer was recorded. Further, the wafer was rotated in the same direction for 45 degrees each to set the each rotation angle of 45, 90 or 135 degrees and repeat the same measurement. The 8 totaled measured values obtained by these 4 times measurements were averaged at each position on the diameter with respect to the center of the wafer, which resulted in the FIG. 8. The figure shows the temperature distribution in the example 1 is far more uniform throughout to the peripheral region of the wafer as compared with the comparative example.

Example 2

A wafer having coarser roughness of the peripheral region was prepared by surface-grinding the backside of the double-side mirror polished standard sample wafer. That is, the backside of the sample wafer was finished by grinding with an infeed type surface grinder so that the roughness is finer in the central region, coarser in the peripheral region. The roughness value of the finished surface and the variable extent within the surface was adjusted by varying a kind of grindstone, a rotating rate of the grindstone or a rotating rate of the wafer.

When measured by Chapman's optical roughness meter, the roughness distribution of the backside of the sample wafer is shown in table 2.

TABLE 2

|  | Annular rim region within 5 mm from outer periphery | Annular rim region within 190 mm~195 mm from center | Central region within 190 mm from center |
| --- | --- | --- | --- |
| Ra nm | 300 | 210 | 30 |
| Rmax nm | 2500 | 2000 | 1010 |

Figure 9:
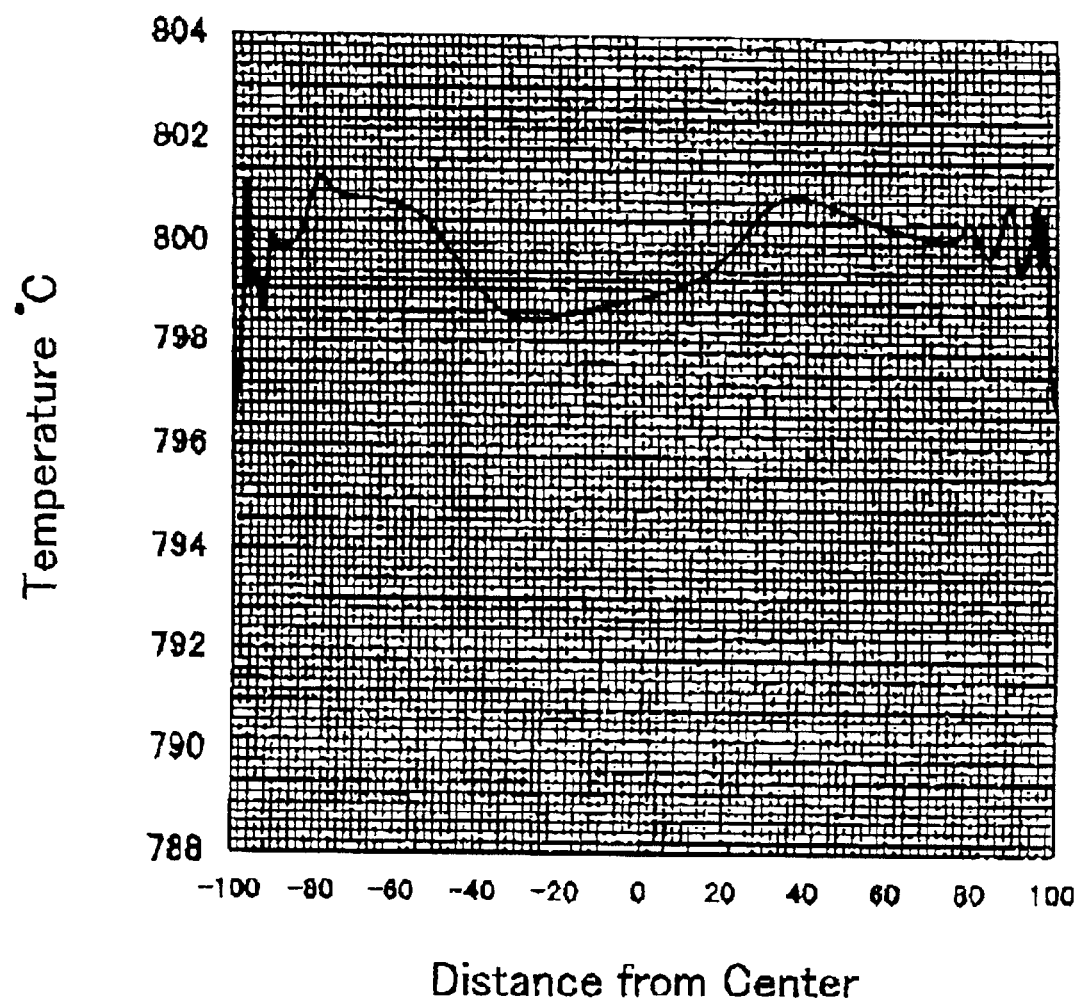
FIG. 9 is a graph showing a temperature distribution in the surface of a wafer.

A sample described in table 2 was set on the holding means 47 and the chamber was evacuated by the evacuating apparatus. The slide beam 43, the slide jig 42 and others were set so that the receiving end of the radiation 41 can move above the diameter of the wafer for any distance in any direction, keeping the appropriate definite altitude of about 100 mm above the surface of the wafer W. The temperature in the surface of the wafer is adjusted at approximately 800° C. with a heating device. The temperature of predetermined points in the surface of the wafer W was measured at the predetermined time interval to ascertain the surface temperature of the wafer W became steady state. After that, the wafer in the fixed state (the position in this state is defined as 0 degree of wafer rotation angel) was scanned from the left to the right of the figure with the receiving end 41 to move at a constant velocity and the measured temperature in the surface of the wafer was recorded. Further, the wafer was rotated in the same direction for 45 degrees each to set the each rotation angle of 45, 90 or 135 degrees and repeat the same measurement. The 8 totaled measured values obtained by these 4 times measurements were averaged at each position on the diameter with respect to the center of the wafer, which resulted in the FIG. 9. The figure shows the temperature distribution in the example 2 is far more uniform throughout to the peripheral region of the wafer as compared with the comparative example.

Example 3

Figure 12:
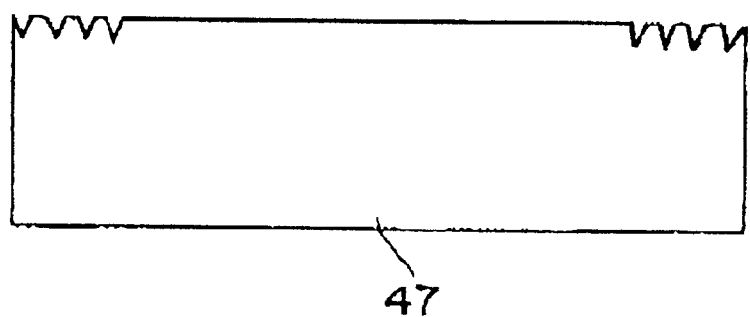
FIG. 12 is a schematic drawing depicting a wafer holding means (an alumina electrostatic chuck) provided recesses on the surface.

As an example of a wafer holding means, contact area between the surface of an alumina electrostatic chuck and the surface of the backside of a wafer was varied in the direction of the radius by providing coaxially v-shaped circular grooves of 10 micron width on the surface of the alumina electrostatic chuck as shown in FIG. 12.

The obtained characteristic of the surface of the electrostatic chuck is shown in table 3. An apparent contact rate 100% herein means a state of the surface of the electrostatic chuck having no recesses (grooves); an apparent contact rate 90% means a state of the surface of the electrostatic chuck having recessed area of 10% total contact area of the wafer.

TABLE 3

|  | Annular rim region within 5 mm from outer periphery | Annular rim region within 190 mm~195 mm from center | Central region within 190 mm from center |
|---|---|---|---|
| apparent contact rate % | 90 | 100 | 100 |

Figure 10:
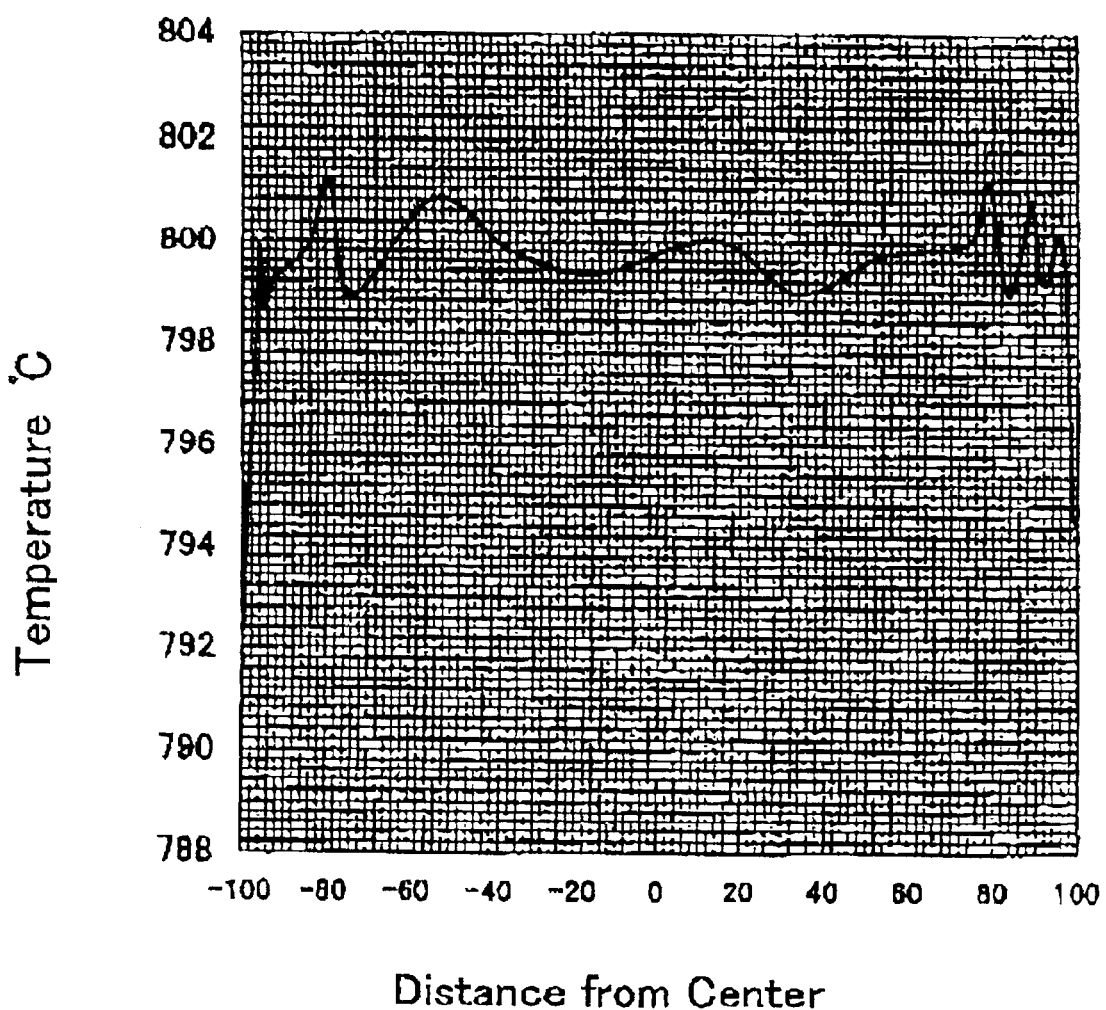
FIG. 10 is a graph showing a temperature distribution in the surface of a wafer.

A sample described in table 3 was set as the holding means 47 and evacuated by the evacuated apparatus and the chamber was evacuated by the evacuating apparatus. The slide beam 43, the slide jig 42 and others were set so that the receiving end of the radiation 41 can move above the diameter of the wafer for any distance in any direction, keeping the appropriate definite altitude of about 100 mm above the surface of the wafer W. The temperature in the surface of the wafer is adjusted at approximately 800° C. with a heating device. The temperature of predetermined points in the surface of the wafer W was measured at the predetermined time interval to ascertain the surface temperature of the wafer W became steady state. After that, the wafer in the fixed state (the position in this state is defined as 0 degree of wafer rotation angel) was scanned from the left to the right of the figure with the receiving end 41 to move at a constant velocity and the measured temperature in the surface of the wafer was recorded. Further, the wafer was rotated in the same direction for 45 degrees each to set the each rotation angle of 45, 90 or 135 degrees and repeat the same measurement. The 8 totaled measured values obtained by these 4 times measurements were averaged at each position on the diameter with respect to the center of the wafer, which resulted in the FIG. 10. The figure shows the temperature distribution in the example 3 is far more uniform throughout to the peripheral region of the wafer as compared with the wafer of the comparative example.

Example 4

Figure 11:
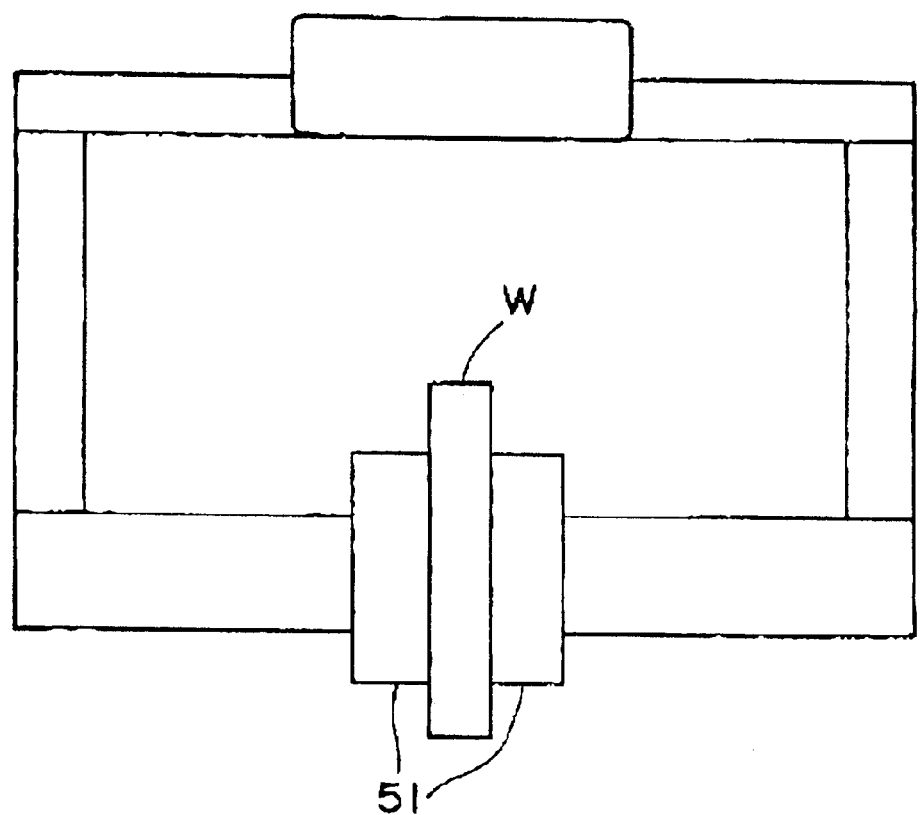
FIG. 11 is a schematic drawing depicting a jig for etching the peripheral annular region of a wafer.

This example shows an effect of facilitating to detach a wafer off the electrostatic chuck. A 200 mm diameter etched silicon wafer was treated for 400 minuets at 750° C. in the wet oxygen atmosphere to form theremal oxide film of 600 Å on the surface of the silicon wafer. The both sides of the wafer were firmly sandwiched with discs of fluorocarbon resin pad 51 having outer diameter of 160 mm as its center of the both sides of the wafer is met and the wafer is fixed as shown in FIG. 11. The sandwiched wafer in the fluorocarbon resin pads was dipped in 5% HF aqueous solution for 3 minuets to remove the exposed oxide film of 20 mm width from the periphery. After that, the whole backside surface of the wafer was polished to remove the residual oxide film and polish the exposed silicon surface of 20 mm width from the periphery. With this process, the former protected region remained as nearly previous etched surface; the latter exposed region became the finished surface wherein 0.75 micron thickness silicon layer was removed from the previous etched surface by the polishing. When measured brightness on the backside of the wafer, the value of the central region indicated 45% and that of the peripheral region indicated 92%. The surface roughness was as shown in FIG. 4 by Chapman's or TMS roughness meter.

TABLE 4

| Roughness meter | central region Chapman | peripheral region of 20 mm width TMS |
|---|---|---|
| Ra nm | 180 | 90 |
| Rmax nm | 2500 | 2072 |

Figure 1:
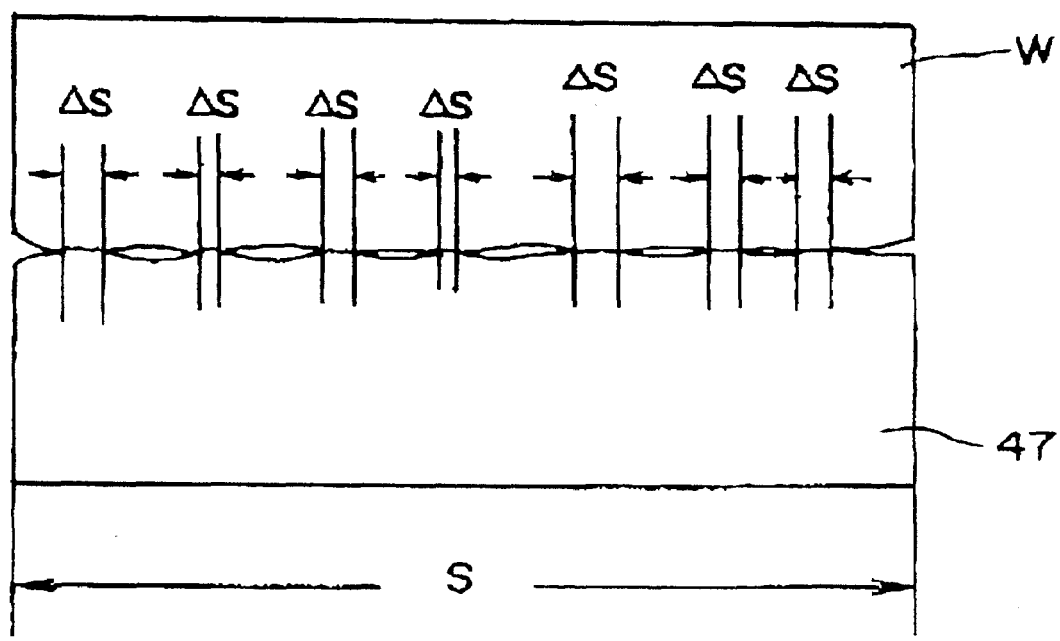
FIG. 1 is a schematic drawing of microscopic sectional view of a contact region.
Figure 2:
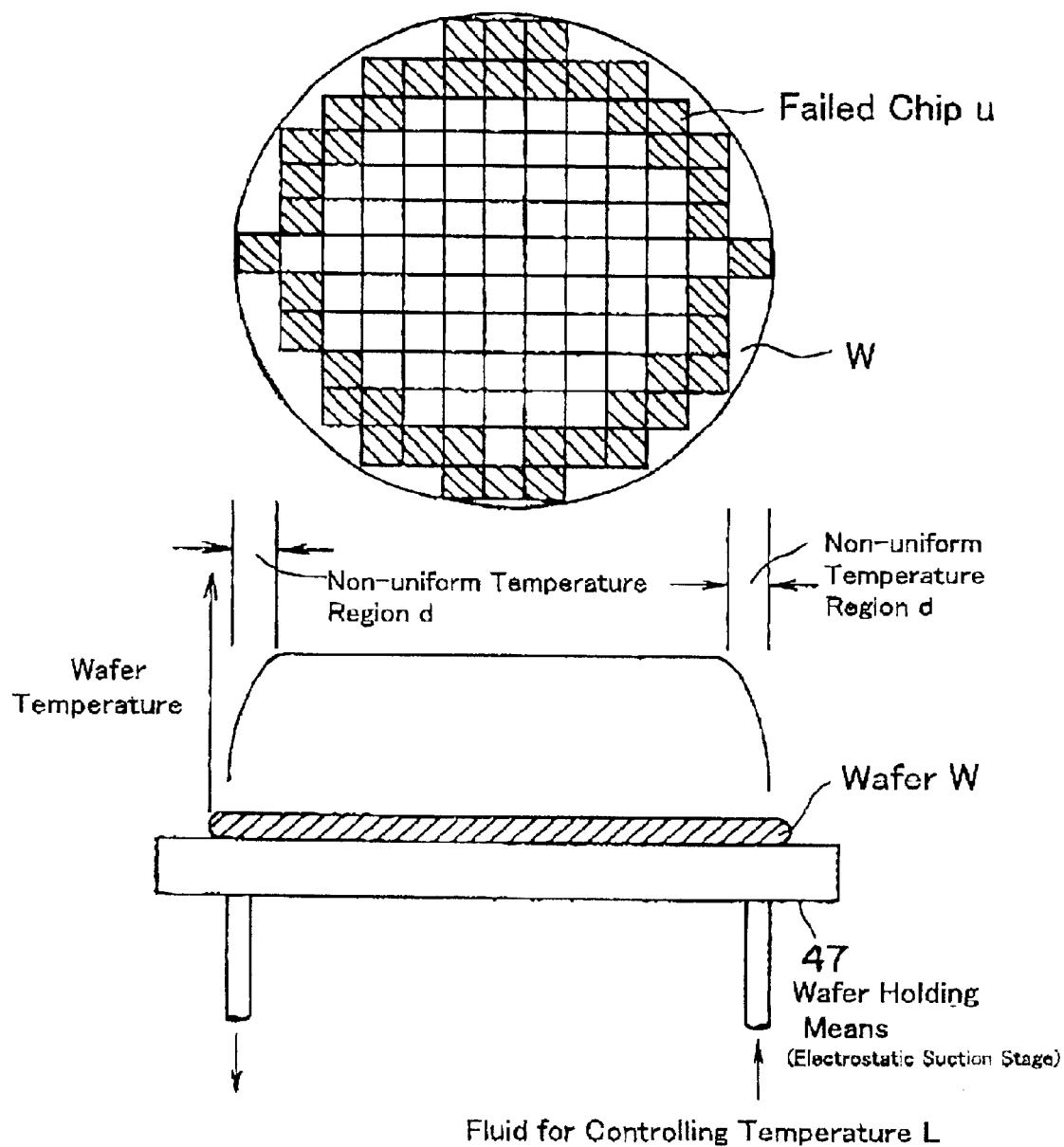
FIG. 2 is a schematic drawing illustrating the surface temperature distribution in a wafer in a process chamber for fabricating devices and generation of failed chips near peripheral part.
Figure 3:
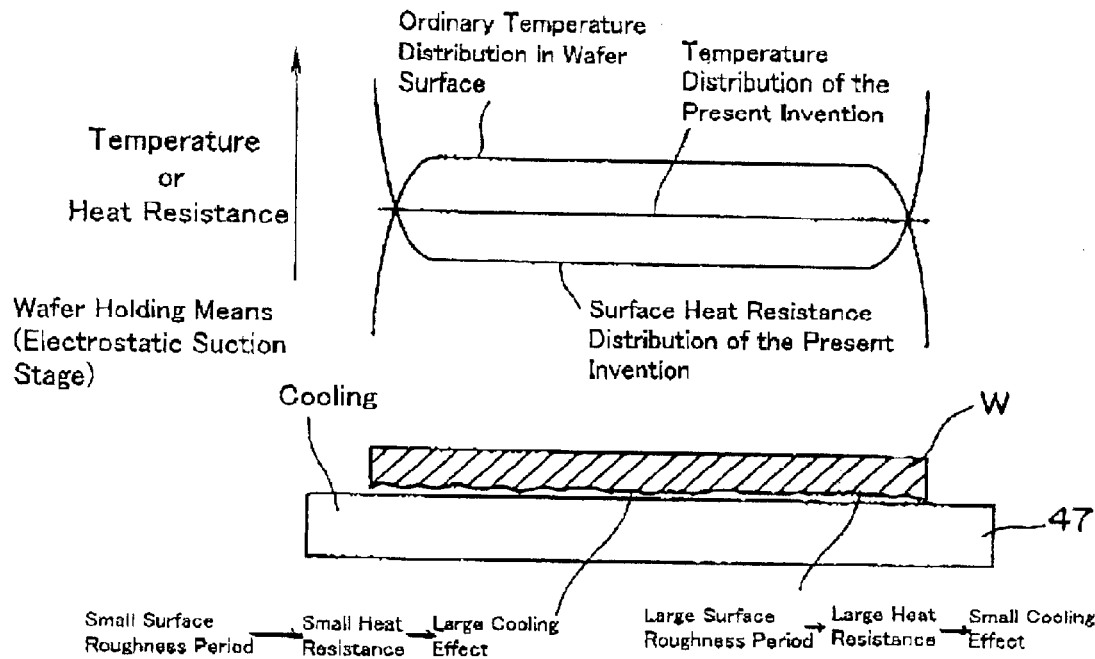
FIG. 3 is a schematic drawing illustrating to attempt to even the surface temperature distribution by giving a surface roughness distribution to the backside of a wafer.
Figure 3:
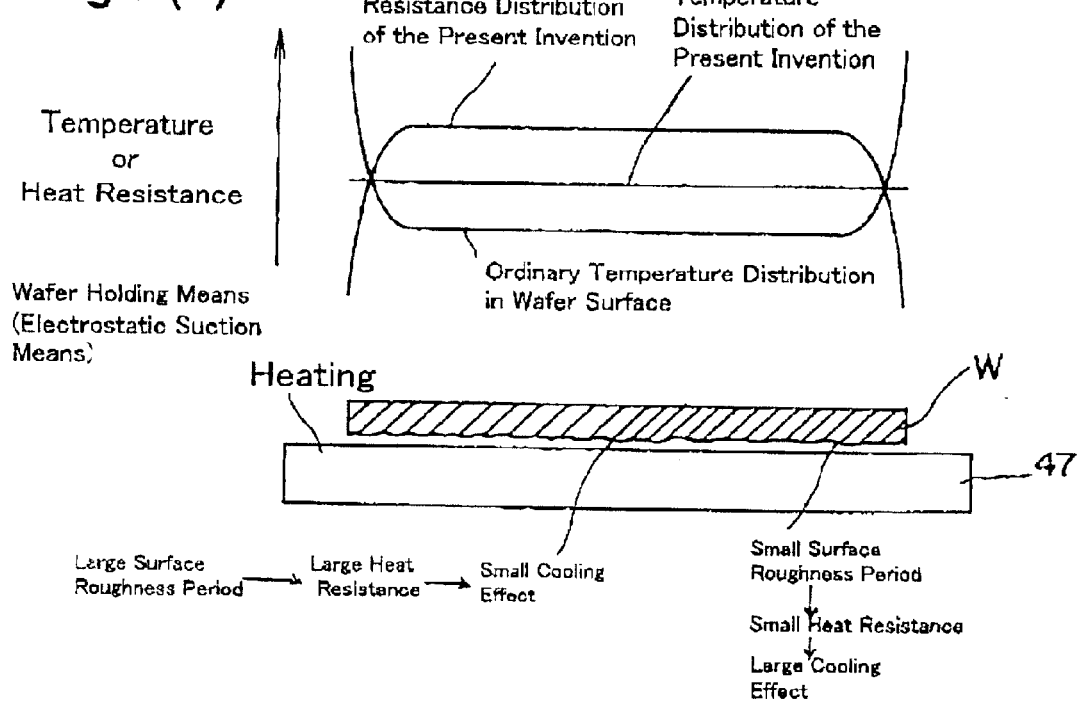
Figure 4:
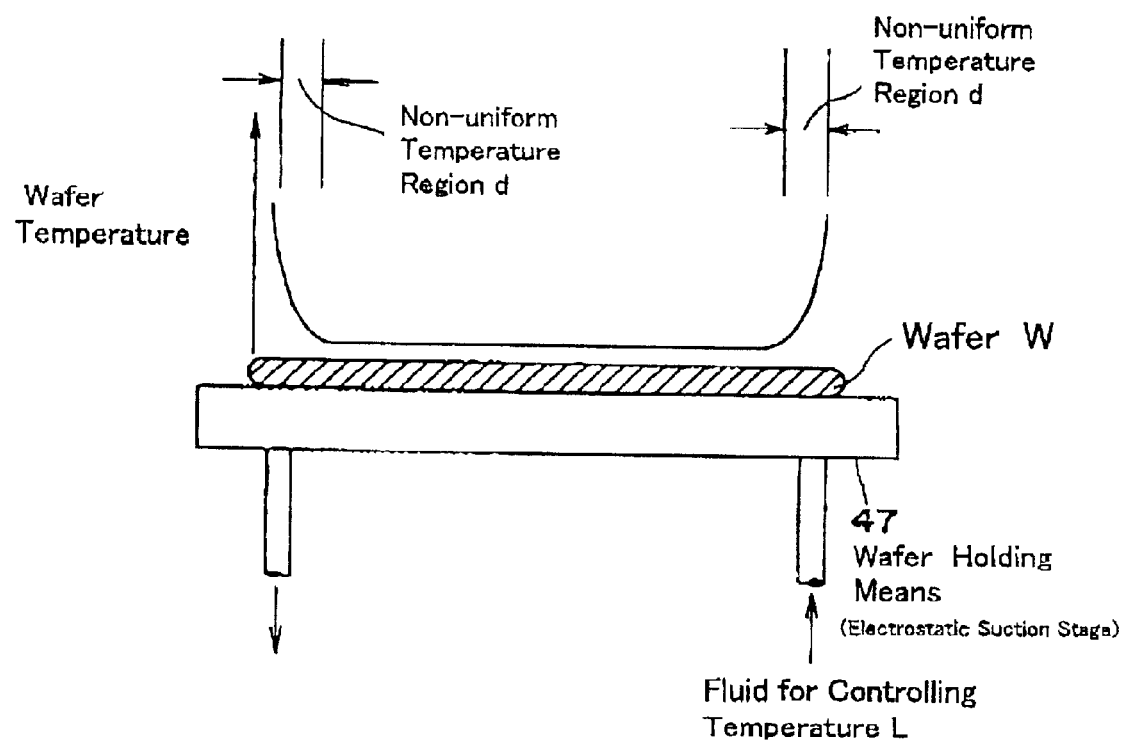
FIG. 4 is a schematic drawing showing the surface temperature distribution in a wafer in a process chamber of for fabricating devices.
Figure 5:
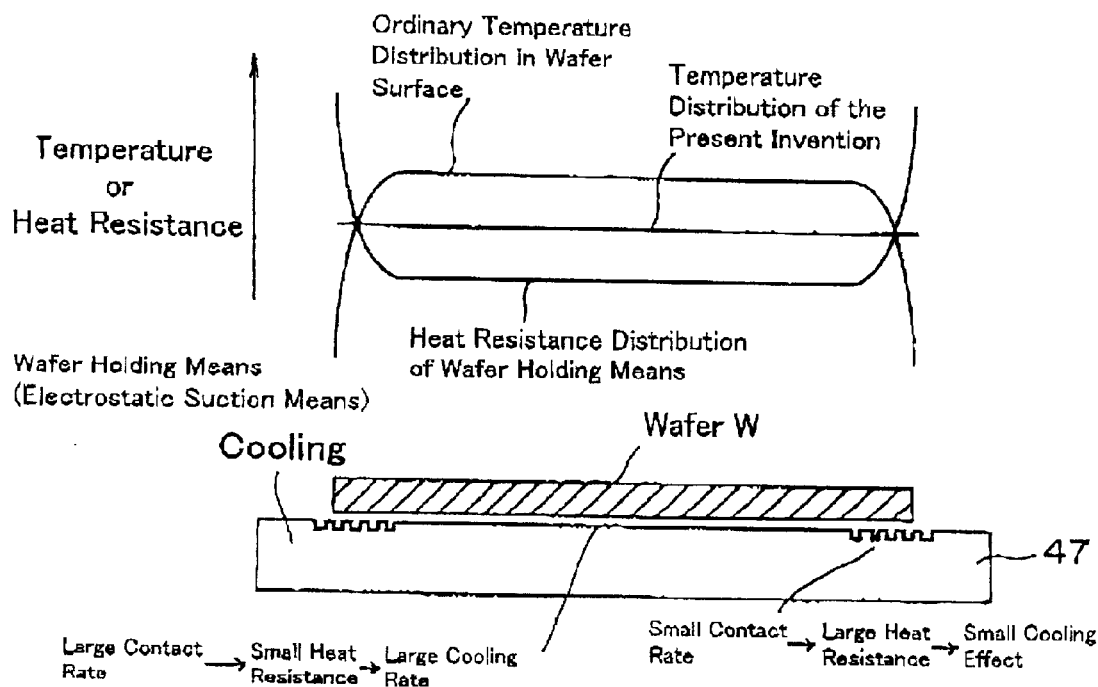
FIG. 5 is a schematic drawing illustrating to attempt to even the surface temperature distribution by giving a contact surface density distribution to the surface of a wafer holding means (an electrostatic chuck).
Figure 5:
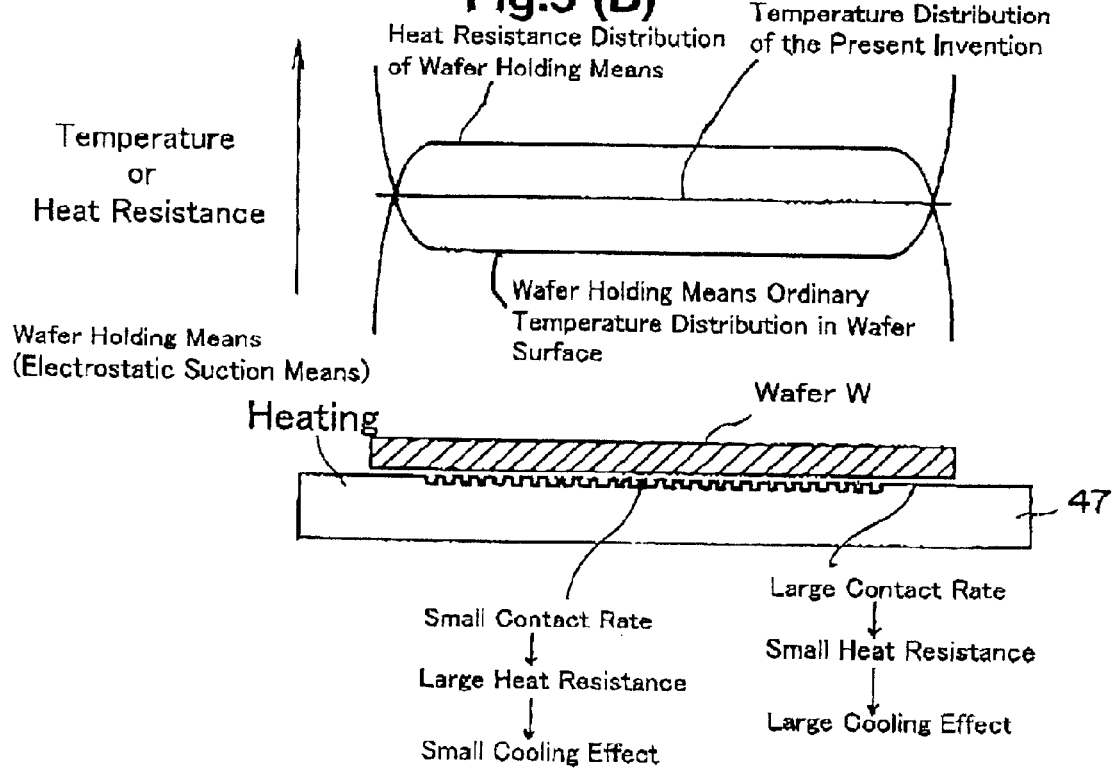

When the sample of FIG. 4 was chucked on an electrostatic chuck applying a voltage of 600V, which is a wafer holding means of a dry-etching apparatus and the backside of the wafer were pressurized with a low pressure of helium in a chamber of 0.1 Torr, no leakage of helium was observed so that the wafer was firmly held by suction. Right after eliminating the applied voltage, the vacuum in the chamber was broken to the atmospheric pressure, and when the wafer was taken off from the chuck, the wafer was easily removed from the chuck.

The measurement was carried out by Chapman or TMS (Texture Measurement System) roughness meter, which are shown as follows.

Chapman: Chapman Instruments, MP2000+
TMS: Schmitt Measurement System, Inc., MS3000-W

INDUSTRIAL APPLICABILITY

When a semiconductor wafer is held on a wafer holding means in a process for fabricating devices, the present invention solved various problems or improved many drawbacks concerning the hold of the wafer on the process for fabricating devices by adjusting the state of the backside of the wafer or the surface of the wafer holding means so that a contact surface density between the surface of the wafer holding means and the backside of the wafer has a distribution, which brought about the effect on the productivity or production yield of the process for device fabrication.

What is claimed is:

1. A semiconductor wafer having a roughness of a wafer backside surface varied in a direction of a radius, wherein varied sections exist substantially coaxially in the direction of the radius.

2. A semiconductor wafer according to claim 1, wherein the variation of the roughness of the wafer backside surface in the direction of the radius is continuous in the direction of the radius.

3. A semiconductor wafer according to claim 1, wherein the variation of the roughness of the wafer backside surface in the direction of the radius is stepwise so that the roughness varies with each respective annular width in the radius direction.

4. A semiconductor wafer according to claim 1, wherein a roughness wavelength of a coarser section in the roughness of the wafer backside surface is within the range of 5 to 100 μm.

5. A semiconductor wafer having a roughness of a wafer backside surface varied in a direction of a radius, wherein sections of the different roughness exist at least in a peripheral part of the wafer and in arbitrary sections radially inward of the periphery.

6. A semiconductor wafer according to claim 5, wherein the variation of the roughness of the wafer backside surface in the direction of the radius is continuous in the direction of the radius.

7. A semiconductor wafer according to claim 5, wherein the variation of the roughness of the wafer backside surface in the direction of the radius is stepwise so that the roughness varies with each respective annular width in the radius direction.

8. A semiconductor wafer according to claim 5, wherein a roughness wavelength of a coarser section in the roughness of the wafer backside surface is within the range of 5 to 100 $\mu$m.

9. A semiconductor wafer, which is held on a wafer holding means by a face to face contact of a whole backside surface of the wafer, having a contact surface density forming means of the backside surface of the wafer, the contact surface density forming means prepared so as to vary in a direction of a radius to have a varying contact surface density distribution in the direction of the radius with respect to the contact surface density of the backside surface of the wafer to the wafer holding means.

10. A semiconductor wafer according to claim 9, wherein the contact surface density forming means is a surface roughness distribution varied in the direction of the radius.

11. A method for processing a semiconductor wafer comprising polishing a backside of a wafer and providing a surface roughness of the wafer backside varying substantially coaxially in a direction of a radius by at least one process means not including a polishing process.

12. A method for processing a semiconductor wafer according to claim 11, wherein the at least one process means is etching or surface grinding.

13. A method for processing a semiconductor wafer comprising forming an oxide film on a backside of a wafer, removing the oxide film partially by etching, and removing the residual oxide film by polishing a whole area of the wafer backside, whereby providing coaxially a roughness distribution approximately in a direction of a radius.

14. A method for processing a semiconductor wafer according to claim 13, wherein the partial removal of the oxide film by etching comprises tightly inserting the wafer coaxially between two pads of corrosion-resistant material having the shape of a disk with a diameter smaller than a diameter of the wafer, and removing an exposed, annular edge part of the oxide film by etching.

15. A method for processing a semiconductor wafer according to claim 13, wherein the partial removal of the oxide film by etching comprises tightly inserting the wafer coaxially between two annular pads of corrosion-resistant material having an outer diameter equal to or larger than a diameter of the wafer and an inner diameter smaller than the diameter of the wafer and removing an exposed, inner part of the oxide film in the shape of a disk by etching.

16. In an apparatus for fabricating semiconductor devices wherein a whole backside surface of a wafer is held by a wafer holding means by face to face contact to carry out device fabricating processes thereon, said apparatus for fabricating semiconductor devices comprising a means for adjusting a contact surface density at least on a surface of the wafer holding means, the backside surface of the wafer or a means for applying contact pressure between both surfaces so as to have varying contact surface densities between the wafer and the surface of the wafer holding means in a direction of the wafer diameter.

17. An apparatus for fabricating semiconductor devices according to claim 16, wherein the means for applying contact pressure between the wafer holding means and the backside of the wafer is a means for adjusting the electrostatic charge of an electrostatic chuck.

18. An apparatus for fabricating semiconductor devices according to claim 16, wherein the contact surface density of the surface of the wafer holding means is adjusted by giving nearly coaxially a roughness distribution in a direction of a radius of the wafer.

19. An apparatus for fabricating semiconductor devices according to claim 18, wherein the roughness distribution is formed by forming a gathering of annular recesses, dotted recesses or a combination thereof on a center or outer part of the surface of the wafer holding means to contact the wafer surface.

* * * * *